United States Patent [19]
Miyauchi et al.

[11] Patent Number: 5,285,413
[45] Date of Patent: Feb. 8, 1994

[54] SEMICONDUCTOR MEMORY DEVICE HAVING SELECTIVE AND SIMULTANEOUS WRITE FUNCTION

[75] Inventors: Mayu Miyauchi; Shotaro Kobayashi, both of Tokyo, Japan

[73] Assignee: NEC Corporation, Tokyo, Japan

[21] Appl. No.: 667,984

[22] Filed: Mar. 12, 1991

[30] Foreign Application Priority Data

Mar. 12, 1990 [JP] Japan ............................... 2-61409
Mar. 30, 1990 [JP] Japan ............................... 2-84041

[51] Int. Cl.$^5$ ............................................. G11C 7/00
[52] U.S. Cl. ........................ 365/189.04; 365/189.12; 365/202
[58] Field of Search ............... 365/189.04, 189.12, 365/190, 202, 900

[56] References Cited

U.S. PATENT DOCUMENTS

| | | | |
|---|---|---|---|
| 4,493,059 | 1/1985 | Isogai | 365/154 |
| 4,567,578 | 1/1986 | Cohen et al. | 365/189.04 |
| 4,616,341 | 10/1986 | Andersen et al. | 365/189.04 |
| 4,733,376 | 3/1988 | Ogawa | 365/221 |
| 4,740,922 | 4/1988 | Ogawa | 365/189.04 |
| 4,879,685 | 11/1989 | Takemae | 365/189.04 |
| 4,879,692 | 11/1989 | Tokushige | 365/189.01 |
| 4,882,708 | 11/1989 | Hayakawa et al. | 365/189.04 |
| 4,888,772 | 12/1989 | Tanigawa | 371/27 |

*Primary Examiner*—William L. Sikes
*Assistant Examiner*—Toan Tran
*Attorney, Agent, or Firm*—Sughrue, Mion, Zinn, Macpeak & Seas

[57] ABSTRACT

A semiconductor memory device includes a memory cell array including plural memory cells arranged in an array, and plural bit lines and word lines connected to said memory cells respectively, a simultaneous writing data bus which is supplied with simultaneous writing data, and a simultaneous data wiring circuit which responsive to control signals, connects the simultaneous writing data bus with bit lines which are connected to the memory cells connected under the same word line in the memory cell array. By constructing the memory as above, the same data can be written in all the memory cells under the same word line within a single cycle, and compared to the prior art which has to write in by selecting bit line pairs each time by a column decoder, the operational speed can be remarkably enhanced.

10 Claims, 8 Drawing Sheets

SEMICONDUCTOR MEMORY DEVICE HAVING SELECTIVE AND SIMULTANEOUS WRITE FUNCTION

BACKGROUND OF THE INVENTION

1. Field of the Invention

This invention relates to a semiconductor memory device, and more particularly to a semiconductor memory device for images.

2. Description of the Prior Art

Semiconductor memories have been widely used in recent years for office automation equipments including personal computers. Among such semiconductor memory devices, MOS random access memory (RAM) can be used as the memory for displaying images on a display unit of a personal computer and the like.

A memory device is provided between a CPU and a display unit in a personal computer so that image data may be random accessed by CPU. In a semiconductor memory such as this, addresses in a memory region are provided to correspond to pixels on the display unit. For instance, each of the horizontal scanning lines corresponds to a row address while each bit (pixel) on the horizontal scanning line corresponds to a column address.

In the image processing operation, all of the bits on a horizontal scanning line are sometimes made 0 or 1 by such operation as clearing of the display screen. In this case, the same data should be written in for all the bits of each horizontal scanning line.

However, as the semiconductor memory device is random accessed in the prior art, data writing should be conducted in the unit of bit on a horizontal scanning line. In other words, the same data of 0 or 1 should be written in different cycles respectively for the plural memory cells under the corresponding word in the memory. When a command such as "clear" which should have an access to all the bits on a horizontal scanning line is given, the prior art memory requires a long time to process it, proving to be quite inconvenient.

BRIEF SUMMARY OF THE INVENTION

Object of the Invention

An object of this invention is to provide a semiconductor memory which can reduce the time required for a series of operations when an action is called for to write-in the same data on plural memory cells which are under the same word line.

Summary of the Invention

The semiconductor memory device according to this invention includes a memory cell array comprising plural memory cells in an array, plural bit lines and word line which are connected to the memory cells respectively, a data bus for simultaneous multi-write-in which is supplied with the data for simultaneous write-in, and a simultaneous data write-in circuit which simultaneously connects the simultaneous data bus with the bit lines connected to the memory cells which are connected under the same word line in the memory array. The simultaneous data bus is provided in the number of two or one corresponding to a memory cell array.

The memory cell array is preferably provided with plural pairs of bit lines and sense amplifiers in a ratio of one sense amplifier against two bit lines so that when the sense amplifier is activated, the levels of the pair of the bit lines become complementary to each other.

This invention may be applicable to the case where a memory device includes bit lines connected to memory cells which are connected under the same word line in a memory cell array and data registers which are connected to the bit lines via a switch circuit.

BRIEF DESCRIPTION OF THE DRAWINGS

The above-mentioned and other objects, features and advantages of this invention will become more apparent by reference to the following detailed description of the invention taken in conjunction with the accompanying drawings wherein.

DETAILED DESCRIPTION OF THE INVENTION

Figure 1:
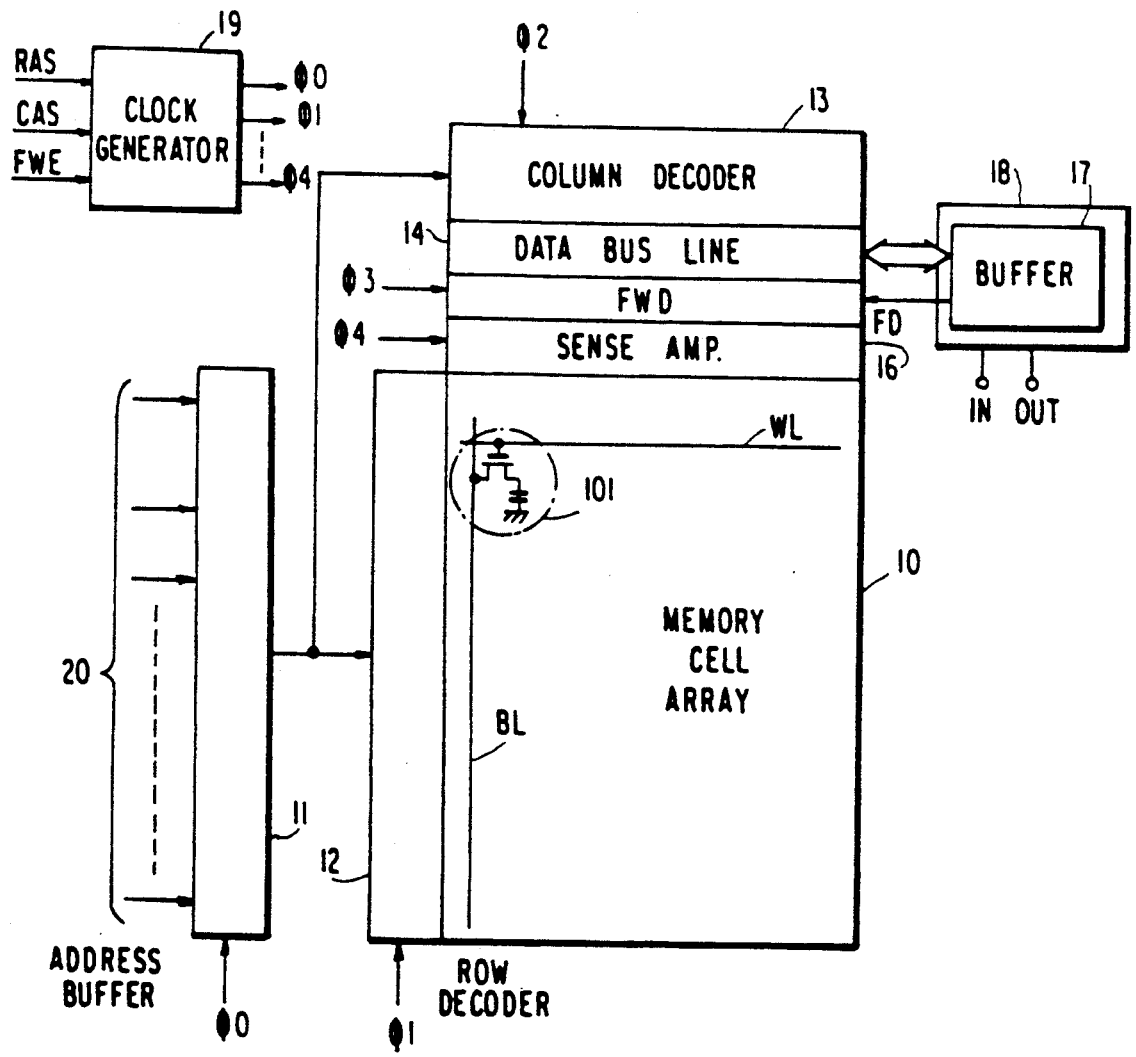
FIG. 1 is a block diagram to show the structure of the first embodiment of the semiconductor memory device according to this invention.

The first embodiment of the semiconductor memory device is now described for the entire structure referring to FIG. 1. A memory cell array 10 is structured with one-transistor-one capacitor type cells 101 in the form of an array, each cell comprising one N-channel type MOS transistor and one capacitor element. Corresponding to an address signal supplied from an address buffer 11 respectively, a row decoder 13 selects one of the plural word lines and a column decoder 12 selects one of the plural pairs of bit lines, each pair of which is connected to one sense amplifier. The address signals are supplied in time division from an address line 20 to the address buffer 11. A clock generator 19 receives as inputs RAS signals, CAS signals and simultaneous data write-in mode signals FWE which are supplied from outside, and generates control signals $\phi 0$, $\phi 1$, ... $\phi 4$ respectively to the signals. A sense amplifier 16 is activated by a signal $\phi 4$ to detect and amplify the potential of the bit line which is selected from all the memory cells under the word line BL corresponding to the input address signal. A data bus line 14 connects the pair of bit lines selected by the column decoder 13 with a RAMI/O port for read-out and write-in of the data. The simultaneous data write-in circuit FWD writes-in the data for simultaneous writing FD which are supplied from a buffer 17 in the RAMI/O port 18 on all the memory cells under the same word line in the memory cell array 10 responsive to the signal $\phi 3$.

Figure 2:
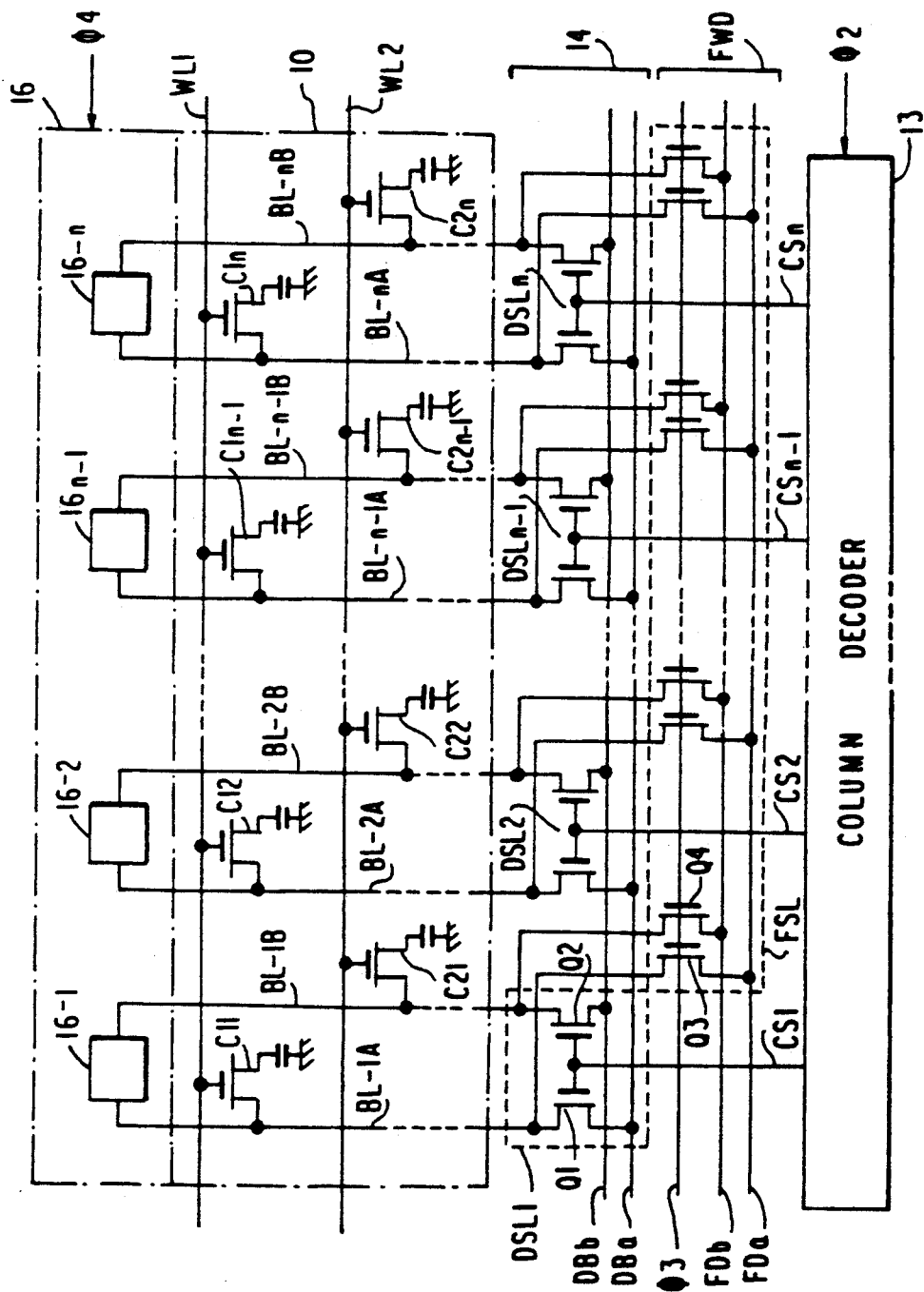
FIG. 2 is a circuit diagram to show a partial structure of the semiconductor memory device shown in FIG. 1.

FIG. 2 shows the partial structure of the semiconductor memory device of FIG. 1 with essential parts which are relevant to this invention. FIG. 2 is a circuit diagram to show an embodiment of the circuit structure of the memory cell array 10, data bus line 14 and simultaneous write-in circuit FWD of FIG. 1.

As shown in FIG. 2, a predetermined number of memory cells are connected to the word lines WL1, WL2, ... in the memory cell array 10 respectively (for example, memory cells C11, C12, ... C1n−1, C1n are connected to the word line WL1). Pairs of bit lines BL-1A and BL-1B, B1-2A and BL-2B, ... BL-n-1A and BL-n-1B, BL-nA and BL-nB are connected to sense amplifiers 16-a, 16-2, ... 16-n−1, 16-n respectively.

The data bus line 14 comprises data buses DBa and DBb which are supplied with data of different and complementary levels and switch circuits DSL1, DSL2, ... DSLn which controls the connection between these buses DBa and DBb and the bit line pairs. The data buses DBa and DBb feed the read-out data in a complementary manner to the buffer 17 (see FIG. 1) provided within the RAMI/O port 18. In other words, the buffer 17 receives the data in a complementary manner. The switch circuits DSL1, DSL2, ... DSLn comprise respectively transistor Q1 of which source-drain paths are connected between DBa and bit lines BL-1A, BL-2A, ... BL-nA and transistors Q2 of which source-drain paths are connected between DBb and bit lines BL-1B, BL-2B, ... BL-nB respectively, their gates receiving selection signals CS1, CS2, ... CSn on their gates from the column decoder 13.

The simultaneous data write-in circuit FWD comprises data buses FDa and FDb which supply in a complementary manner the data for simultaneous write-in data FD which are supplied from the buffer 17 (see FIG. 1) in the RAMI/O port 18 and a switch circuit FSL which controls the connection between FDa and FDb and bit line pairs. The switch circuit FSL comprises transistors Q3 of which source-drain paths are connected between FDa and bit lines BL-1A, BL-2A, . .. BLnA and transistors Q4 of which source-drain paths are connected between FDb and bit lines BL-1B, BL-2B, ... BL-nB, their gates being connected to signals lines of $\phi 3$.

The operation of read-out and write-in of data by the semiconductor memory device shown in FIGS. 1 and 2 will now be described referring to FIG. 3. During the period TR in which conventional random access mode is executed, when RAS signal for row active is inputted (see FIG. 3(a)), the clock generator 19 feeds $\phi 0$ to the address buffer 11 (see FIG. 3(e)) and a row address R is supplied to the address buffer 11 from outside (see FIG. 3(c)). Row address signal is fed to the row decoder 12 from the address buffer 11, signal $\phi 1$ for driving the word line is supplied to the row decoder 12 from the clock generator 19 (see FIG. 3(f)), and one word line selected by the row address signal is turned to the high level (see FIG. 3(g)). Then, a sense amplifier active signal $\phi 4$ becomes high level (see FIG. 3(h)). The sense amplifier 16 detects and amplifies the bit line either at high level or low level corresponding to the information which is either 0 or 1 stored in the memory cells which are connected to the selected word line (see FIG. 3(j)). The other bit line of the pair is amplified by the same sense amplifier at the level complementary to the level of the selected bit line, or in other words to the opposite voltage level.

Then, CAS signal of row active is inputted (see FIG. 3(b)), and column address C is supplied to the address buffer 11 (see FIG. 3(c)), and sent to the column decoder 13. The signal $\phi 2$ for activating the column decoder 13 is supplied from the clock generator to the column decoder 13 (see FIG. 3(i)), and as one of the selection signals CS1, CS2, ... CSn from the column decoder 13 is turned to the high level, either one of the switch circuits DSL1, DSL2, ... DSLn is activated and one of the plural bit pairs is selected.

By the above operation, a bit line of one cell which corresponds to the input address, and the other bit line which forms a pair with the above bit line are connected to the data buses DBa and DBb.

In the case of read-out operation, as the information of the selected cell corresponds to either high or low level state of the selected bit line pair, the level of the bit line pair is outputted from an output OUT of the RAMI/O port 18 via the data bus line 14 (see FIG. 3(d)). In the case of write-in operation, the data inputted from an input IN of the RAMI/O port 18 is fed from the buffer 17 via the data bus line 14 in order to force the level of the selected bit line to either a high or low level and write-in the data in the cell.

Upon completion of the operation of read-out or write-in, RAS and CAS signals are turned to a high level, or in other words become non-active, and correspondingly signals $\phi 0$, $\phi 1$ and $\phi 2$ are turned to a low level consecutively to complete a cycle of read-out or write-in for the semiconductor memory device.

During the operation, the simultaneous data write-in mode signal FWE is kept at a low level (see FIG. 3(k)), and the signal $\phi 3$ maintains the state of low level (see FIG. 3(l)). The simultaneous data write-in circuit FWD assumes the non-active state during the cycle of write-in or read-out.

Figure 3:
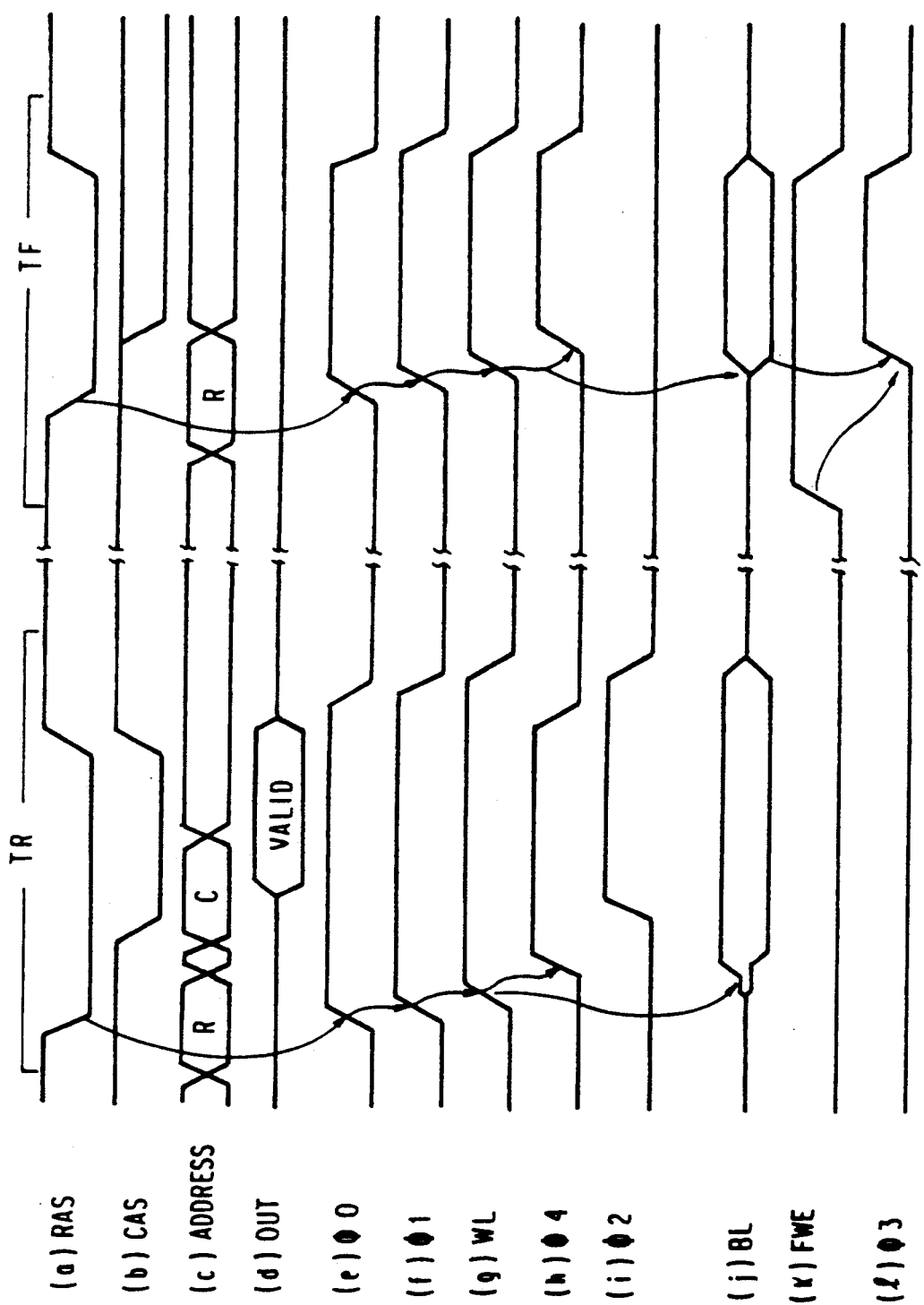
FIG. 3 is a timing chart to explain the operations of the semiconductor memory device shown in FIGS. 1 and 2.

Referring now to FIGS. 1 and 3, the operation to write-in the same data simultaneously on all the memory cells under the same word line in the memory cell array 10 (in TF period) will be described. When the simultaneous data write-in mode signal FWE is inputted from outside at the clock generator 19 (see FIG. 3(k)), the semiconductor memory device is turned to assume the mode for simultaneous data writing.

In this mode, when RAS signal is inputted first (see FIG. 3(a)), the clock generator 19 supplies $\phi 0$ to the address buffer 11 (see (FIG. 3(e)), and the row address to designate the word line for which the simultaneous writing is to be made is supplied to the address buffer 11 from outside (see FIG. 3(c)). The row address signal is sent from the address buffer 11 to the row decoder 12, the signal $\phi 1$ to drive the word line is supplied from the clock generator 19 to the row decoder 12 (see FIG. 3(f)), and a word line selected by the row address signal is turned to a high level (see FIG. 3(g)).

By this time, data for simultaneous write-in has been inputted at the data input IN of RAMI/O port 18, and the buffer 17 (FIG. 1) has generated the complementary data for simultaneous writing to send to the data buses FDa and FDb.

The input of FWE causes the clock generator 19 to generate the signal $\phi 3$ (see FIG. 3(l)), and the signal is sent to the switch circuit FSL of the circuit FWD. As a result, the switch circuit FSL becomes active, the data bus FDa is connected to all the bit lines BL-1A, BL-2A, ... BL-nA, and similarly the data bus FDb is connected to all the corresponding bit lines BL-1B, BL-2B, ... BL-nB (see FIG. 3(j)).

As the sense amplifier activation signal $\phi 4$ achieves a high level later (see FIG. 3(h)), the sense amplifier 16 detects and amplifies the bit lines either at a high or a low level (see FIG. 3(j)).

By the above operation, all the bit lines which are connected to the memory cells under the same word line are turned to the voltage level for the simultaneous writing data FD, and the data FD are written on all the cells.

Upon completion of the operation for simultaneous writing, RAS and CAS signals are turned to high level or non-active, and correspondingly the signals $\phi 0$, $\phi 1$, $\phi 3$ and $\phi 4$ are turned to low level sequentially to complete one cycle of the operation for simultaneous data write-in mode of the semiconductor memory device.

As described in the foregoing statement, according to this invention, the same data can be written-in all the memory cells under the same word line within a single cycle, and therefore the speed in the processing can be remarkably increased compared to the prior art device where all the bit line pairs are selected each time by a column decoder for write-in operation.

Figure 4:
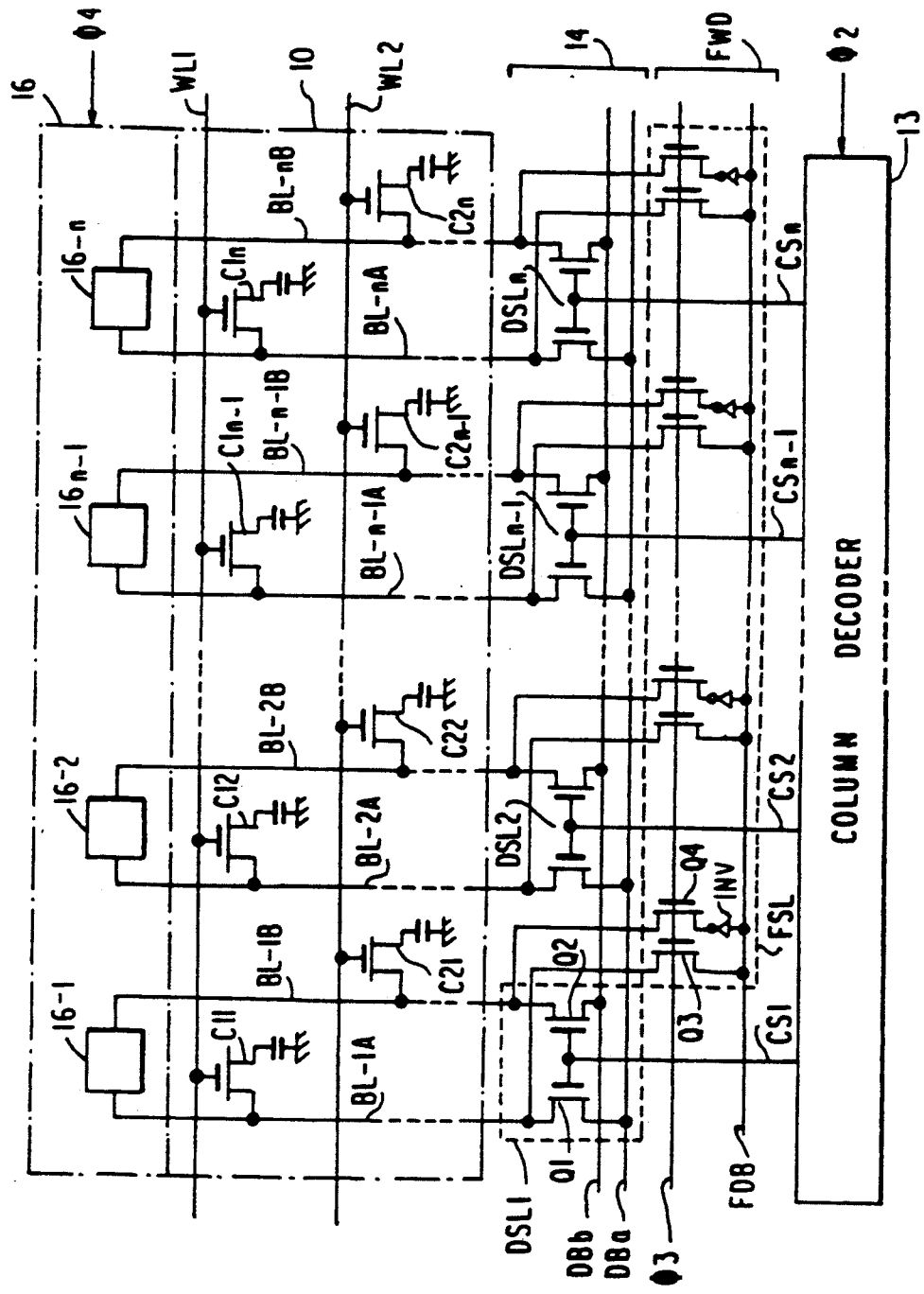
FIG. 4 is a circuit diagram to show a partial structure of the second embodiment of this invention.

The second embodiment of this invention will now be described referring to FIG. 4. This embodiment differs from the first embodiment in that the number of data bus for supplying the data FD for simultaneous writing is one. While the first embodiment in FIG. 3 required two data buses FDa and FDb, the simultaneous writing data FD is supplied from the buffer 17 (FIG. 1) to the pairs of bit lines BL-1A and BL-1B, BL-2A and BL-2B, ... BL-n-1A and BL-n-1B, BL-nA and BL-nB by a single data bus FDB as shown in FIG. 4. One inverter INV each is provided between the one bit line of each pair and data bus FDB in order to make levels of the bit lines of a pair complementary to each other. All the other structures and operations of the circuit are identical to those in the first embodiment. The same codes are given to the same component parts in both embodiments.

Compared to the first embodiment, the number of data buses can be reduced in the second embodiment to thereby further reduce the area of a memory device.

There has recently been proposed a semiconductor memory device for images which has two types of input/output ports. More specifically, the memory device has a random port which are usually provided in conventional semiconductor memory devices for re-writing the data in a memory cell array by an access from the CPU, and a serial port which supplies image signals continuously to a display unit. This type of semiconductor memory device is generally called a dual port memory.

Figure 5:
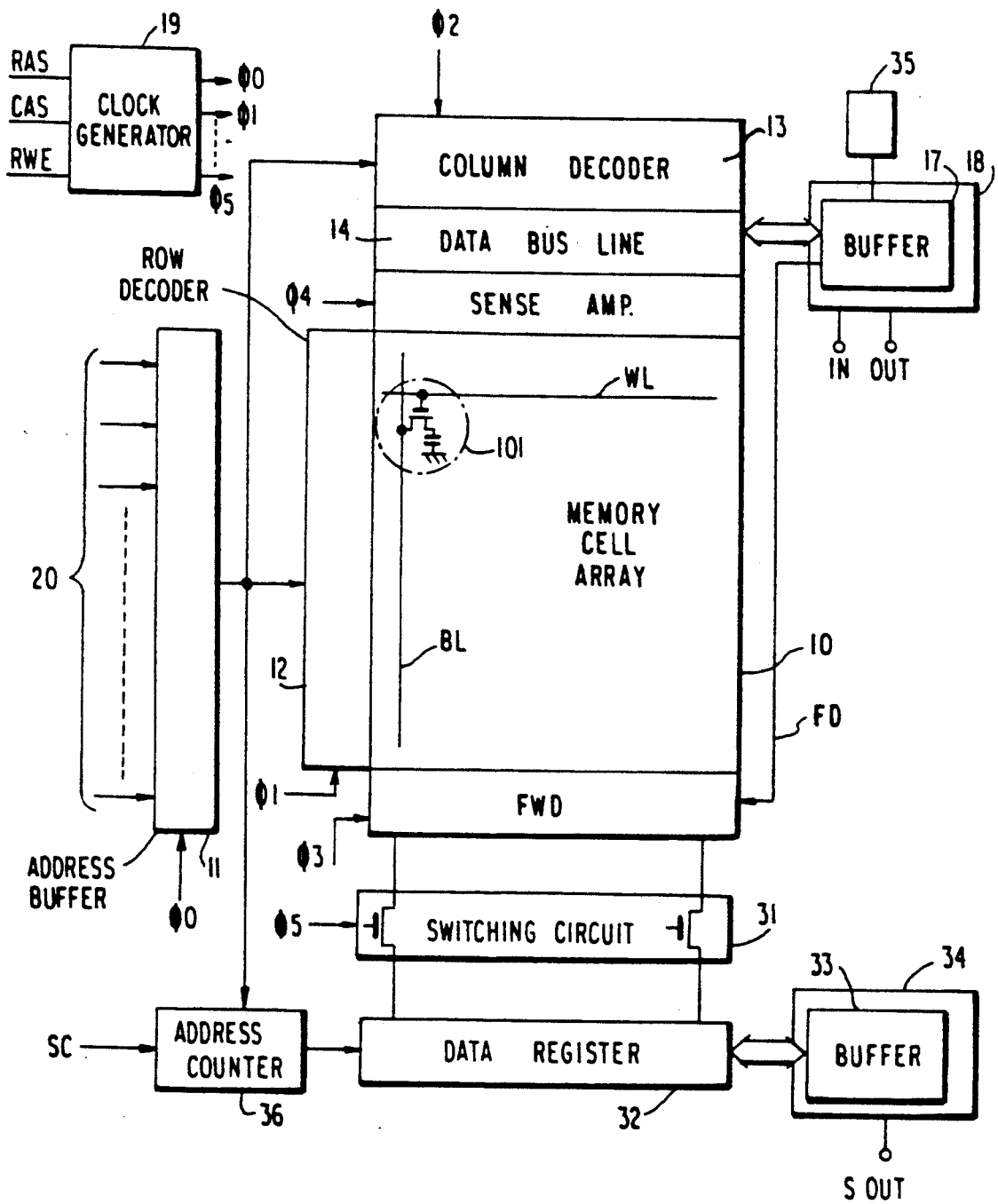
FIG. 5 is a block diagram to show the structure of the third embodiment of this invention semiconductor memory device.

Description will not be given to an application of this invention to a dual port memory by referring to FIG. 5. Compared to the first and second embodiments, this embodiment has a simultaneous data writing circuit FWD which is structured more suitable for integration.

As shown in FIG. 5, this embodiment is structured with a serial I/O port 35 for serial random access, a data register 32, a switch circuit 31 and an address counter 36 in addition to the structure of the semiconductor memory shown in FIG. 1. The clock generator 19 generates signal $\phi 5$ for activating the switch circuit 31, too. The data FD for simultaneous writing is supplied from the register 35 which is provided for the purpose.

The data register 32 is an n-bit shift register which stores registers of the number corresponding to the bit line pairs of the memory cell 10, and is connected to the bit line pairs of the memory cell array 10 via the switch circuit 31. The data register 32 is structured with, for instance, D-type flip-flops in the number of n, and outputs the data to a buffer 33 inside the serial I/O port 35 corresponding to the clock signals from the address counter 36. The address counter 36 receives as input a sampling signal SC and the leading address outputted from the address buffer 11, and outputs clock signals corresponding to the sampling signals and the leading address to the data register. The switch circuit 31 receives as input the signal $\phi 5$ which assumes a high level in the data transfer mode, and controls conduction between the bit line pairs and the data register 32 corresponding to the signal $\phi 5$. The data for simultaneous writing FD is stored in the register 35 in advance and supplied to the data bus FDB of the simultaneous data writing circuit FWD via the buffer 17. The embodiment has the structure similar to the one shown in FIG. 1 otherwise.

Figure 6:
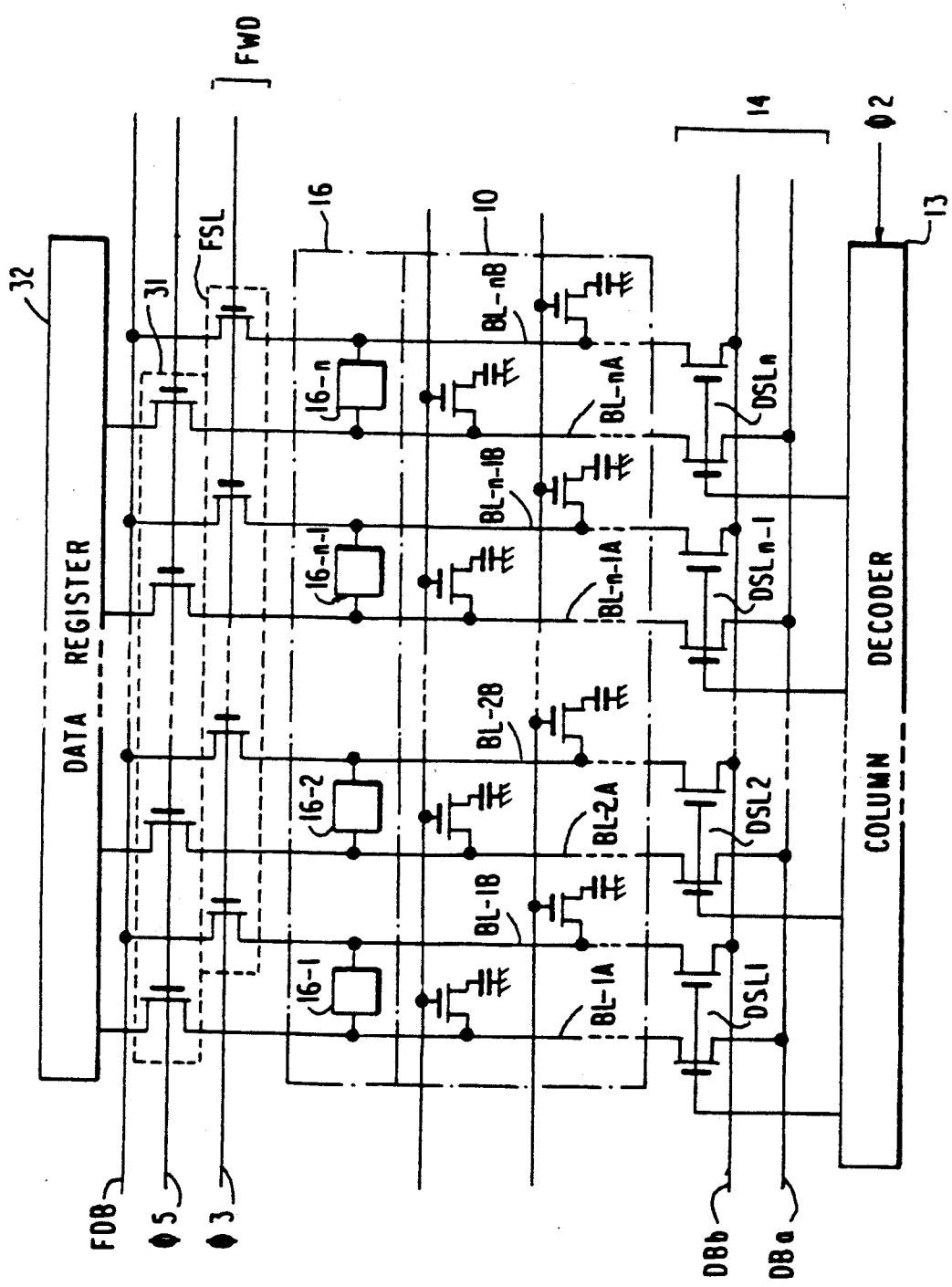
FIG. 6 is a circuit diagram to show a partial structure of the semiconductor memory device shown in FIG. 5.

The structure of the semiconductor memory device shown in FIG. 5 will now be described in more detail by referring to FIG. 6. FIG. 6 shows an embodiment of the circuit structure with a memory cell array 10, a data bus line 14, a simultaneous data writing circuit FWD and a switch circuit 31 shown in FIG. 5. The same reference numbers are attached to the same component parts as in FIG. 2.

As shown in FIG. 6, the structure with a memory cell 10, a sense amplifier 16, a column decoder 13 and a data bus line 14 is identical to the first embodiment shown in FIG. 2, and the description will therefore be omitted.

The data register 32 is, as stated above, an n-bit shift register comprising registers in the number corresponding to the number of the bit line pairs of the memory cells 10. As a register comprises D-type flip-flops, it is no more necessary to input complementary signals; it may simply be connected to a single bit line. The registers of the number n are respectively connected to one of the bit lines of each pair via a switch circuit 31 (in this embodiment, bit line BL-1A, BL-2A, ... BL-nA). The switch circuit 31 comprises a group of transistors of which source-drain paths are connected between the data transistor 32 and the bit lines BL-1A, BL-2A, ... BL-nA to receive signal $\phi 5$ at their gates.

The data bus FDB which is supplied with the data for simultaneous writing FD connects via the switch circuits FSL the data FD for simultaneous writing which is sent from the buffer 17 (FIG. 5) in the RAMI/O port 18 with one of the bit lines (in this embodiment bit lines BL-1B, BL-2B, ... BL-nB) of the bit line pairs which are not connected with the data registers. The switch circuit FSL comprises a group of transistors which receives $\phi 3$ at their gates and the source-drain paths of which are connected between the data bus FDB and bit lines BL-1B, BL-2B, ... BL-nB.

In this embodiment, the simultaneous data write-in circuit FWD may be constructed with a single data bus FDB, and a switch circuit FSL comprising transistors in a number corresponding to a pair of bit lines. Therefore, the number of component parts can be reduced to further reduce the area of the semiconductor memory as a whole.

Figure 7:
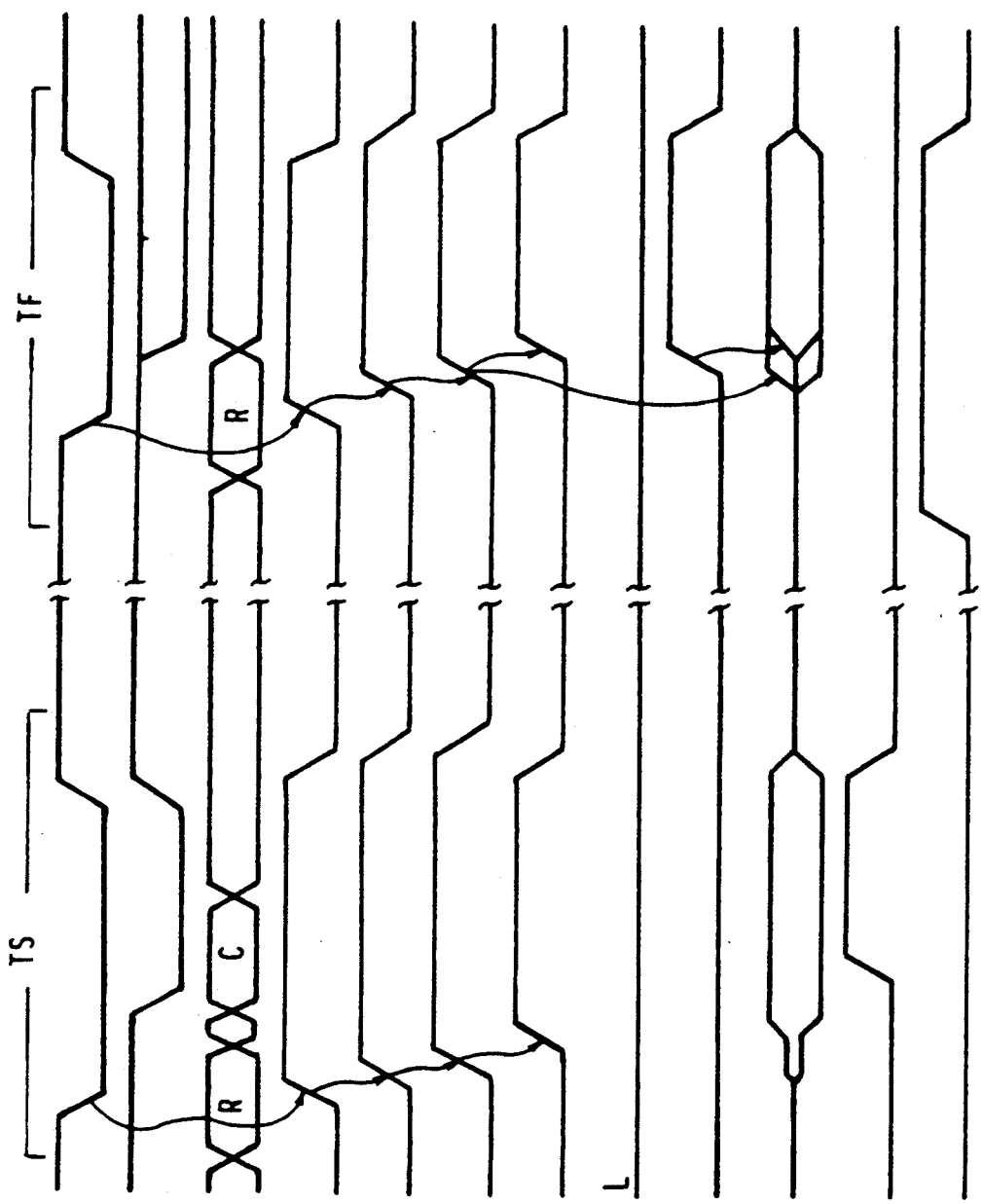
FIG. 7 is a timing chart to explain the operation of the semiconductor memory device shown in FIGS. 5 and 6.

The operation of this embodiment will now be described by referring to FIG. 7. As the operation of read-out/write-in of data with random access is similar to the first and second embodiments, description is omitted (see the period TR in FIG. 3). The operation of data transfer between the memory cell 10 and the data register 32 in the semiconductor memory device shown in FIGS. 5 and 6 is described below for the period TS in FIG. 7.

When RAS signal of row active is inputted (see FIG. 7(a)), the clock generator 19 supplies $\phi 0$ to the address buffer 11 (FIG. 7(d)), and a row address designating the word line which should be transferred to the data register 32 is supplied to the address buffer 11 from outside (FIG. 7(c)). The row address signal is sent to the row decoder 12 from the address buffer 11, and signal $\phi 1$ for driving the word line is supplied from the clock generator 19 to the row decoder 12 (FIG. 7(e)) to turn the word line which has been selected with the row address signal to a high level (FIG. 7(f)). As the sense amplifier active signal $\phi 4$ becomes high level (see FIG. 7(g)), the sense amplifier 16 detects and amplifies bit lines to either high or low level corresponding to either 0 or 1 of the information stored in the memory cell which is connected to the selected word line (see FIG. 7(j)).

Subsequently, CAS signal of row active is inputted (see FIG. 7(b)), a column address is supplied to the column decoder 13 (FIG. 7(c)). Then, the signal $\phi 5$ for activating the switch circuit 31 is supplied from the clock generator 19 to connect all the bit lines with the data register 32 (FIG. 7(k)).

If the operation is the one for transferring data from the memory cell array 10 to the data register 32 (or read-out operation), as the information of the cells under the selected word line corresponds to a high or a low level of the bit lines of n number each of which is connected to the cell respectively, the levels of the bit lines in the number of n are stored respectively in corresponding registers of the number n.

If it is the operation of transferring data from the data register 32 to the memory cell array 10 (or writing-in operation), the data of n bits in the data register 32 are written-in the cells by forcing the levels of the corresponding bits either to a high or a low level.

Upon completion of the data transfer operation, the signals of RAS and CAS become high level, or in other words non-active, and correspondingly the signals $\phi 0$, $\phi 1$ and $\phi 5$ become low level sequentially to complete a cycle of the data transfer operation between the semiconductor memory and the data register.

During the operations, the simultaneous data write-in mode signal FWE stays at a low level (see FIG. 7(l)). Therefore, the circuit FWD remains non-active during the cycle of data transfer operation.

The operation to serially output the data in the data register 32 from an output SOUT of the serial I/O port 34 is operable fully asynchronously from the operation of read-out/write-in by means of RAMI/O port 18 except for the data transfer operation. More particularly, data can be outputted to the buffer 33 in the serial I/O port 34 responsively to the clock signal from the address counter 36.

Description will now be given to the operation of writing the same data simultaneously in all the memory cells under the same word line in the memory cell array 10 (during the period TF in FIG. 7). When simultaneous data write-in mode signal FWE is inputted from outside (see FIG. 7(l)), the semiconductor memory assumes the mode for simultaneous data writing.

In this mode, when RAS signal is first inputted (FIG. 7(a)), the clock generator 19 supplies $\phi 0$ to the address buffer 11 (FIG. 7(d)), and a row address signal for designating the word line for which simultaneous writing should be made is supplied to the address buffer 11 from outside (see FIG. 7(c)). A row address signal is applied to the row decoder 12 from the address buffer 11, the signal $\phi 1$ for driving the word line is supplied from the clock generator 19 to the row decoder 12 (see FIG. 7(e)), and the word line which has been selected with the row address signal becomes high level (see FIG. 7(f)).

By this time point, the simultaneous writing data FD has been supplied to the data bus FDB from the buffer 17 (FIG. 1) provided within the RAMI/O port 18.

Then, the signal $\phi 3$ is supplied from the clock generator 19 (see FIG. 7(i)), the switch circuit FSL becomes active to connect the data bus FDB with all the bit lines BL-1B, BL-2B, ... BL-nB or one of the bit lines of each pair (see FIG. 7(j)).

As the sense amplifier active signal $\phi 4$ becomes high level (see FIG. 7(g)), the sense amplifier 16 amplifies the other bit lines of the pairs BL-1A, BL-2A, ... BL-nA either to high or low level (see FIG. 7(j)). In other words, the other bit line of each pair becomes the level which is complementary to the level of the bit lines supplied to the data bus FDB or the voltage level opposite thereto. This allows the switch circuit FSL comprising a data bus FDB and transistors in the number corresponding to the number of sense amplifiers to supply the simultaneous write-in data FD to bit line pairs.

With the above operations, the simultaneous write-in data FD are written-in all the memory cells under the same word line.

The bit lines for sending the simultaneous write-in data may be the other bit line of the pairs BL-1A, BL-2A, ... BL-nA instead of BL-1B, BL-2B, ... BL-nB. Then, the data may be changed adequately.

Upon completion of the operation of simultaneous writing of the data, RAS and CAS signals are turned non-active at high level while the signals $\phi 0$, $\phi 1$, $\phi 3$ and $\phi 4$ are turned to low level sequentially to complete one cycle of the simultaneous data writing mode for the semiconductor memory.

As stated in the foregoing, and similarly to the first and second embodiments, this embodiment enables writing of the same data in all the memory cells under the same word line by one cycle, and comparing to the prior art memory which writes-in the data by selecting bit line pairs for each time by the column decoder, the speed of operation being remarkably enhanced. As this embodiment can construct the simultaneous data write-in circuit FWD with one data bus FDB and a switch circuit FSL comprising transistors in the number corresponding to the number of the pair of bit lines further reduce the area of the semiconductor memory as a whole.

Figure 8:
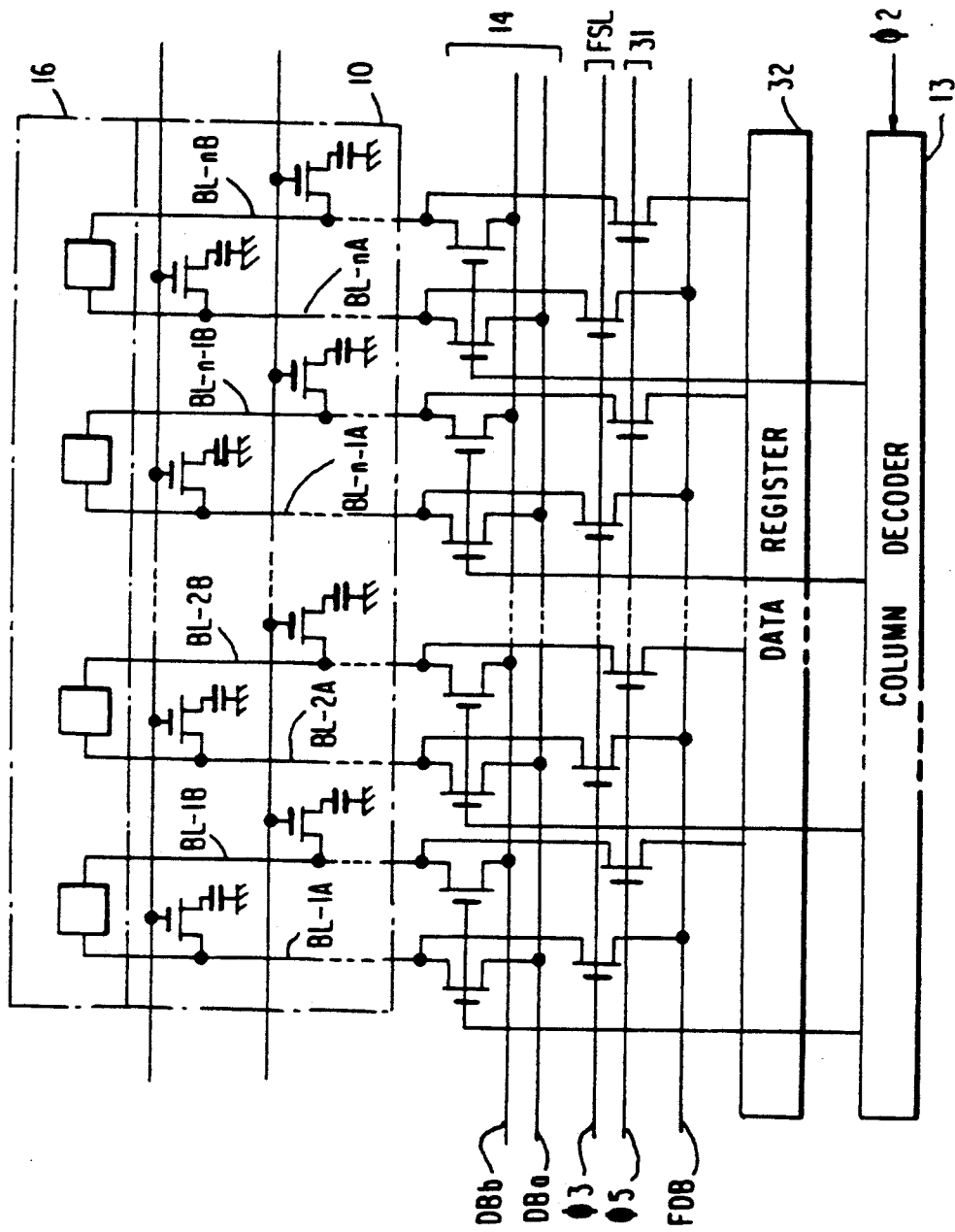
FIG. 8 is a circuit diagram to show a partial structure of the fourth embodiment of this invention.

Referring to FIG. 8, the fourth embodiment of this invention will be described below. This embodiment differs from the third embodiment in that all of the data register 32, the switch circuit 31, the switch circuit FSL for simultaneous writing and the data line FDA circuit FWD are provided in the proximity of the column decoder 13. Although the data bus FDB is connected to the bit lines BL-1A, BL-2A, ... BL-nA while the data register 13 is connected to the other bit lines BL-1B, BL-2B, ... BL-nB, as stated above, the arrangement is similar to that of the third embodiment if the data for simultaneous writing are set at corresponding levels. The circuit structures and operations thereof are therefore identical to those shown in FIG. 3.

By constructing the device as mentioned above, substantial wiring of the semiconductor memory can be shortened to thereby further reduce the area thereof.

Although the invention has been described with reference to specific embodiments, this description is not meant to be construed in a limiting sense. Various modifications of the disclosed embodiments will become apparent to those skilled in the art upon reference to the description of the invention. It is therefore contemplated that the appended claims will cover any modifications of embodiments as fall within the true scope of the invention.

What we claim is:

1. A semiconductor memory device comprising a plurality of word lines, a plurality of bit lines, and a plurality of memory cells each coupled to one of said word lines and one of said bit lines, a row decoder responding to row address information to select one of said word lines, a data bus receiving data to be written into a selected memory cell in a data write mode and data read out from a selected memory cell in a data read mode, a plurality of column switches each coupled between said data bus and a corresponding one of said bit lines, a column decoder responding to column address information to turn one of said column switches ON to electrically connect one of said bit lines to said data bus, a simultaneous-data bus receiving simultaneous data to be written simultaneously into plural ones of said memory cells, a plurality of transfer gates having respective first nodes connected in common to said simultaneous-data bus, respective second nodes connected to different ones of said bit lines and respective control nodes supplied in common with a control signal, each of said transfer gates being turned ON in response to an active level of said control signal to transfer said simultaneous data from said simultaneous-data bus to each of said bit lines simultaneously.

2. The memory device as claimed in claim 1, wherein each of said bit lines comprises true and complementary bit lines, said simultaneous-data bus comprising true and complementary simultaneous-data bus lines, each of said transfer gates comprising a first transistor connected between said true bit line and said true simultaneous-data bus line and a second transistor connected between said complementary bit line and said complementary simultaneous-data bus line, said control signal being supplied in common to gates of said first and second transistors.

3. The memory device as claimed in claim 2, wherein said data bus comprises true and complementary data bus lines and each of said column switches includes a third transistor connected between said true data bus line and said true bit line and a fourth transistor connected between said complementary data bus line and said complementary bit line.

4. The memory device as claimed in claim 1, wherein each of said bit lines comprises true and complementary bit lines, said simultaneous-data bus comprising a single bus line, and each of said transfer gates including a first transistor connected between said true bit line and said single bus line, an inverter having an input node connected to said single bus line and an output node and a second transistor connected between said complementary bit line and the output node of said inverter, said control signal being supplied in common to gates of said first and second transistors.

5. A semiconductor memory device comprising a memory cell array including a plurality of memory cells arranged in rows and columns, a plurality of word lines arranged in rows, and a plurality of pairs of bit lines arranged in columns, each of said pairs of bit lines including first and second bit lines, row decoder means responsive to row address information for selecting one of said word lines, a pair of data bus lines, column decoder means responsive to column address information for selecting one of said pairs of bit lines to connect a selected one of said pair of bit lines to said pair of data bus lines, a data register circuit having a plurality of registers, a simultaneous-data bus line, a plurality of first transfer gates having first nodes connected respectively to said registers of said data register circuit, second nodes connected respectively to said first bit lines in said pairs of bit lines and a first control node supplied in common with a first control signal, and a plurality of second transfer gates having third nodes connected in common to said simultaneous-data line, fourth nodes connected respectively to said second bit lines in said pairs of bit lines and a second control node supplied in common with a second control signal, each of said first transfer gates being turned ON in response to an active level of said first control signal to transfer data appearing on the corresponding one of said first bit lines to a corresponding one of said registers of said data register circuit, and each of said second transfer gates being turned ON in response to an active level of said second control signal to transfer data appearing on said simultaneous-data bus line to a corresponding one of said second bit lines.

6. The memory device as claimed in claim 5, wherein said memory cell array further comprises a first side arranged in a column and a second side arranged in a row, said row decoder means being arranged along said first side of said memory cell array, and said column decoder means, said data register circuit and said first and second transfer gates being all arranged along said second side of said memory cell array.

7. The memory device as claimed in claim 6, wherein said data register circuit is disposed between said column decoder means and said first and second transfer gates.

8. A semiconductor memory device comprising a memory cell array having a rectangular shape defined by first, second, third, and fourth sides, said memory cell array including a plurality of memory cells arranged in rows and columns, a plurality of word lines arranged in rows, and a plurality of pairs of bit lines arranged in columns, each of said pairs of bit lines having first and second bit lines, a row decoder arranged along said first side of said memory cell array and responsive to row address information to select one of said word lines, a data bus arranged along with third side of said memory cell array, a plurality of column switches arranged along said third side of said memory cell array and each coupled between said data bus and a corresponding one of said pairs of bit lines, a column decoder arranged along said third side of said memory cell array and responsive to column address information to turn one of said column switches ON, a simultaneous-data bus line arranged along said third side of said memory cell array, a data register circuit arranged along said third side of said memory cell array and including a plurality of registers, a plurality of first transfer gates arranged along said third side of said memory cell array and each coupled between said first bit line in a corresponding one of said pairs of bit lines and a corresponding one of said registers in said data register circuit, and a plurality of second transfer gates arranged along said third side of said memory cell array and each coupled between said simultaneous-data bus line and said second bit line in a corresponding one of said pairs of bit lines, each of said first transfer gates being turned ON in response to an active level of a first control signal to transfer data appearing on a corresponding one of said first bit lines to a corresponding one of said registers of said data register circuit, and each of said second transfer gates being turned ON in response to an active level of a second control signal to transfer data appearing on said simultaneous-data bus line to a corresponding one of said second bit lines.

9. The memory device as claimed in claim 8, wherein said data register circuit is disposed between said column decoder and said first and second transfer gates.

10. The memory device as claimed in claim 9, wherein said data bus has first and second data bus lines and each of said column switches includes a third transfer gate coupled between said first data bus line and a corresponding one of said first bit lines and a fourth transfer gate coupled between said second data bus line and a corresponding one of said second bit lines.

* * * * *

UNITED STATES PATENT AND TRADEMARK OFFICE
CERTIFICATE OF CORRECTION

PATENT NO. : 5,285,413
DATED : February 8, 1994
INVENTOR(S) : Mayu Miyauchi, et. al.

It is certified that error appears in the above-indentified patent and that said Letters Patent is hereby corrected as shown below:

Column 2, line 44, delete "13" and insert --12--.

Column 2, line 45, delete "12" and insert --13--.

Signed and Sealed this

Ninth Day of August, 1994

Attest:

BRUCE LEHMAN

Attesting Officer     Commissioner of Patents and Trademarks